United States Patent [19]

Mannhardt et al.

[11] 4,097,280

[45] Jun. 27, 1978

[54] WEB WITH OVERLAYS FOR USE IN DOCUMENT PRESENTATION DEVICES OF COPYING MACHINES AND METHOD OF MAKING THE SAME

[75] Inventors: Annemarie Mannhardt, Munich; Rudolf Eppe, Taufkirchen; Josef Pfeifer, Unterhaching, all of Germany

[73] Assignee: AGFA-Gevaert AG, Leverkusen, Germany

[21] Appl. No.: 712,960

[22] Filed: Aug. 9, 1976

Related U.S. Application Data

[63] Continuation of Ser. No. 482,475, Jun. 24, 1974, abandoned.

[30] Foreign Application Priority Data

Jun. 23, 1973 Germany .............................. 2332008

[51] Int. Cl.$^2$ ...................... G03C 5/06; B32B 31/00; B32B 3/00
[52] U.S. Cl. ......................................... 96/44; 96/67; 428/33; 428/53; 428/54; 428/57; 428/58; 428/78; 427/379; 156/300; 156/302
[58] Field of Search .................. 428/33, 53, 54, 57, 428/58, 78; 96/44, 67; 355/40; 427/379; 156/300, 302

[56] References Cited

U.S. PATENT DOCUMENTS

| 1,146,696 | 7/1915 | Eisenkramer | 428/33 |
| 2,598,733 | 6/1952 | Warner | 118/118 |
| 3,036,927 | 5/1962 | Jerothe | 117/7 |
| 3,620,797 | 11/1971 | Feltlowitz | 117/7 |
| 3,868,293 | 2/1975 | Selph | 428/78 X |
| 3,927,233 | 12/1975 | Maidoff | 428/58 |
| 4,021,239 | 5/1977 | Ogawa | 96/44 |

Primary Examiner—P. C. Ives
Attorney, Agent, or Firm—Michael J. Striker

[57] ABSTRACT

A web with overlays for use in the document presentation device of a photographic copying machine has several sheet-like sections with overlapping portions which are separably coupled to each other by snap fasteners and carry overlays which are welded thereto by the application of heat and pressure. The overlays are applied to those sides of the sections which are coated with layers of photographic emulsion.

13 Claims, 3 Drawing Figures

WEB WITH OVERLAYS FOR USE IN DOCUMENT PRESENTATION DEVICES OF COPYING MACHINES AND METHOD OF MAKING THE SAME

This is a continuation of application Ser. No. 482,475, filed June 24, 1974, and now abandoned.

CROSS REFERENCE TO RELATED APPLICATION

The web of the present invention can be utilized in a document presentation device of the type disclosed in the commonly owned copending application Ser. No. 396,458 filed Sept. 12, 1973 by Rudolf Eppe et al. for "Document presentation device for use with copying machines" U.S. Pat. No. 3,880,521.

BACKGROUND OF THE INVENTION

The present invention relates to copying machines in general, and more particularly to improvements in document presentation devices which can place selected overlays or masks into register with an original and with the copying aperture of a document reproducing machine. The invention further relates to improved webs of overlays and to a method of applying overlays to a web-like or strip-shaped carrier.

In accordance with the presently prevailing practice, overlays are applied to a web-like carrier by resorting to a screen printing process. The carrier is provided with a layer of photosensitive material which is exposed to light for reproduction of the images of one or more masters. It is also known to employ overlays in the form of white strips one side of which is coated with an adhesive. Both prior processes are expensive, especially the screen printing. Moreover, an overlay which is applied by screen printing is easy to scratch. An overlay which constitutes an adhesive-coated strip is likely to become separated from or shifted relative to the carrier, especially in response to repeated back-and-forth movement of the carrier between takeup and supply reels. Any shifting of the strips with respect to the carrier will expose at least some adhesive which sticks to the takeup and/or supply reel and whose image appears on the copies as a smudge. Contact between the reels and the adhesive on the carrier causes the latter to offer a greatly increased resistance to lengthwise transport so that the drive means for the reels consumes more energy and is subjected to pronounced wear. Still further, the adhesive-coated strips must be cut by hand to a desired size and shape; this contributes significantly to the cost, not only because the work must be carried out by skilled persons but also because the making of each web takes up a substantial amount of time.

SUMMARY OF THE INVENTION

An object of the invention is to provide a novel and improved method of forming a web of transparent synthetic plastic material with overlays which serve to conceal certain information on the web and/or on an original document when the web is used in the document presentation device of a photographic copying machine.

Another object of the invention is to provide a novel and improved web with overlays for use in the document presentation device.

A further object of the invention is to provide a web wherein the overlays are not likely to be displaced with respect to their carrier, wherein the overlays can be applied to the carrier in a simple, economical and time saving manner by resorting to automatic or semiautomatic machinery, and which can be used as a superior substitute for presently known webs.

An additional object of the invention is to provide a document presentation device which can utilize the improved web.

Still another object of the invention is to provide a novel and improved method of applying overlays or masks to a flexible transparent web-like carrier according to which the cutting of overlays to a desired size and shape takes place simultaneously with attachment of overlays to the carrier.

A further object of the invention is to provide a web which is assembled with overlays in accordance with the improved method and can be transported in a document presentation device at a speed considerably exceeding the maximum permissible speed of lengthwise transport of presently known webs.

An additional object of the invention is to provide a web wherein one or more selected sections can be removed, interchanged, replaced and reconnected to each other in a simple and time-saving manner.

Still another object of the invention is to provide novel and improved quick-release means for separably but reliably coupling the sections of the improved web to each other.

A further object of the invention is to provide a web wherein the separation or replacement of any given section does not necessitate a complete dismantling of the entire web and/or separation of the ends of the web from the cores of supply and takeup reels.

A feature of the present invention resides in the provision of a method of affixing weldable synthetic plastic sheet-like overlays to a web-like carrier which also consists (at least in part) of weldable synthetic plastic material and is movable lengthwise back and forth in a document presentation device of a document reproducing machine so as to place selected portions thereof into register with a copying aperture which is overlapped by an original document which is to be copied simultaneously with information on a selected portion of the carrier. The method comprises the steps of heating the overlays to an elevated temperature and pressing the heated overlays against one side of the carrier so that the overlays are welded or bonded to the carrier without resorting to an adhesive. The temperature to which the overlays are heated is preferably between 100° and 200° C., and the one side of the carrier is preferably coated with a photosensitive emulsion layer prior to the pressing step.

Another feature of the invention resides in the provision of an elongated web which can be used for the aforementioned purpose and includes a flexible transparent carrier having portions movable into register with the copying aperture and at least one mask or overlay which is welded to one side of the carrier. The carrier may consist of two or more sections each of which may but need not have an area which equals or approximates the size of the copying aperture, and the neighboring sections of the carrier are preferably separably connected to each other by snap fasteners or analogous coupling means.

The novel features which are considered as characteristic of the invention are set forth in particular in the appended claims. The improved web itself, however, both as to its construction and the mode of making and using the same, together with additional features and advantages thereof, will be best understood upon perusal of the following detailed description of certain specific embodiments with reference to the accompanying drawing.

DESCRIPTION OF THE PREFERRED EMBODIMENTS

Figure 1:
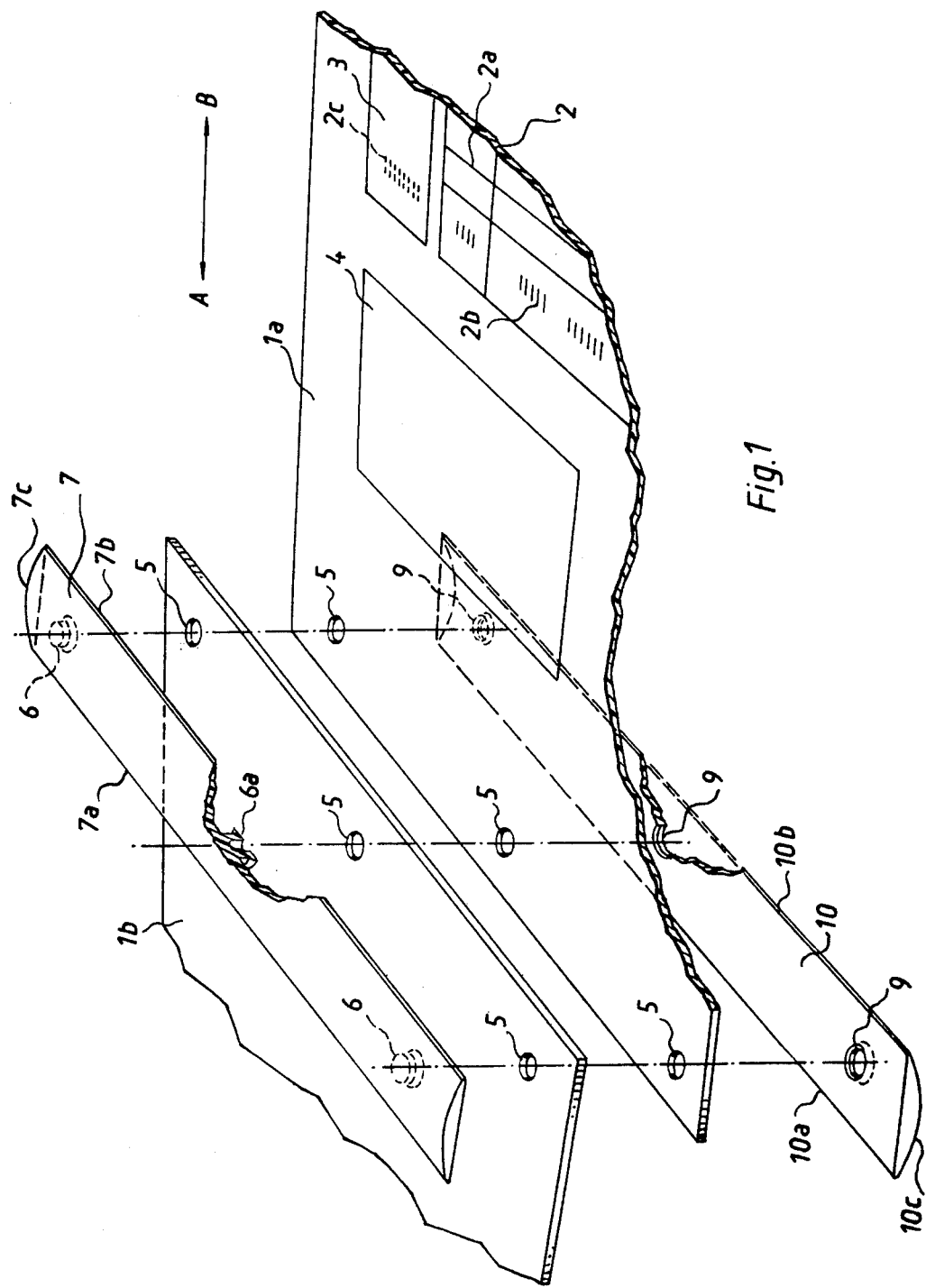
FIG. 1 is an exploded fragmentary perspective view of a web which is constructed in accordance with the invention and wherein two neighboring sections are separably connected to each other by a novel coupling.

FIG. 1 shows two sections 1a and 1b of a composite web whose ends are connected to the cores of two reels in a manner as shown in FIG. 1 of the commonly owned copending application Ser. No. 396,458 filed Sept. 12, 1973 by Eppe et al. The sections 1a, 1b include weldable sheet-like carriers consisting of light-transmitting weldable synthetic plastic material and the upper side of each carrier is provided with a layer 2 of photosensitive material. The information which is applied to the sections 1a, 1b may consist of blanks 2a of invoices, reminders, shipping notices and/or others. The information is exposed onto the layers 2 of the respective sections by resorting to a conventional photographic procedure. The blanks 2a may include printed matter, as shown at 2b. Still further, the sections 1a and 1b include overlays or masks 3 and 4 (shown only on the section 1a) which may be white, otherwise colored or metallized. The mask 3 overlies additional information 2c.

In accordance with a feature of the invention, the overlays are bonded or welded to the carrier of the section 1a by the application of heat and pressure so that they overlie the respective photosensitive layer 2. For example, the carrier of each of the sections 1a, 1b may constitute a commercially available ortho film having a carrier or base layer with a thickness of between 0.1 and 0.18 millimeter and consisting of triacetate and polyester. This base layer carries the photosensitive layer 2. The masks 3 and 4 are applied to the carrier of the section 1a by means of a ram 17 (FIG. 3) which is heated to a temperature of 100°–200° C. (e.g., 120° C.) and presses the masks (whose material is softened by heat) against the layer 2 with a relatively large specific force. The section 1a is ready for use as soon as the ram 17 is withdrawn, i.e., as soon as the masks 3, 4 are bonded by heat and pressure to the respective photosensitive layer 2.

The weldable synthetic plastic material of the masks 3, 4 shown in FIG. 1 is available on the market and is sold under the name LUXOR or ALUFIN (both trademarks). Such material is produced and marketed by the Firm Kurz of Fuerth, Western Germany. These materials are manufactured by applying a heat sensitive release coat to a polyester film, then applying a clear coat of lacquer or a tinted coat of lacquer, and this lacquer coat is then vacuum metallized with aluminum (ALUFIN) or gold (LUXOR). This coating is backed with a heat sensitive adhesive coating and the entire assembly is then transferred to the substrate by heat and pressure. The materials trademarked LUXOR and ALUFIN are available commercially in the United States from the Kurz-Hastings Company of Philadelphia, Pa. The thickness of the masks 3, 4 is between 0.1 and 0.2 millimeter.

It has been found that the temperatures which prevail during application of masks 3, 4 to the carrier of the section 1a do not adversely affect the photosensitive layer 2. The ram 17 which is used for the application of masks to the carriers of sections of a composite web can also serve to sever such masks from a larger sheet of ALUFIN or LUXOR. This contributes to simplicity and lower cost of the mask-applying operation. The matrices which are used for carrying out the operation can be produced by resorting to a photographic process and are thereupon etched.

Each end portion of each of the sections 1a, 1b is provided with a transversely extending row of openings or perforations 5. In assembling a composite web (which may consist of a large number of sections), the perforations 5 at one end of the section 1a are brought into register with perforations 5 in the adjacent end portion of the section 1b, and the thus aligned pairs of perforations 5 receive the shanks of male coupling elements or pins 6 which are provided on an elongated strip 7 having a flat surface facing the adjacent perforations 5 and a convex surface 7c facing away from the perforations. The leading and trailing edges 7a, 7b of the strip 7 (as considered in the directions of lengthwise movement of the web, see the double-headed arrow A-B) are sharp so that the strip 7 resembles a two-edged blade. Those portions of the pins 6 which are remote from the strip 7 taper conically outwardly, as at 6a, so that they can snap into complementary sockets forming part of holes 9 in a second strip 10 having sharp edges 10a, 10b, a convex surface 10c facing away from the perforations 5, and a flat surface facing the flat surface of the strip 7. It can be said that the cross section of each pin portion 6a and each socket increases in a direction away from the strip 7.

The coupling or splicing of the sections 1a, 1b to each other is completed as soon as the conical portions 6a of the pins 6 snap into the conical sockets of the respective holes 9. It will be noted that the pins 6 and the corresponding sockets can be assembled in a manner known from the art of snap fasteners. This furnishes a reliable connection but enables an attendant to rapidly detach the section 1a from the section 1b in order to replace a damaged section or to replace one or both sections with one or two sections which are provided with different information. The thickness of the strips 7 and 10 is exaggerated in FIG. 1 for the sake of clarity. In actual practice of the invention, the combined thickness of the strips 7, 10 (preferably together with the combined thickness of two partially overlapping sections 1a, 1b) need not exceed 3 millimeters. This insures that the splice or joint between the sections 1a, 1b does not interfere with the winding of a relatively long strip onto the core of a supply reel or takeup reel.

Figure 2:
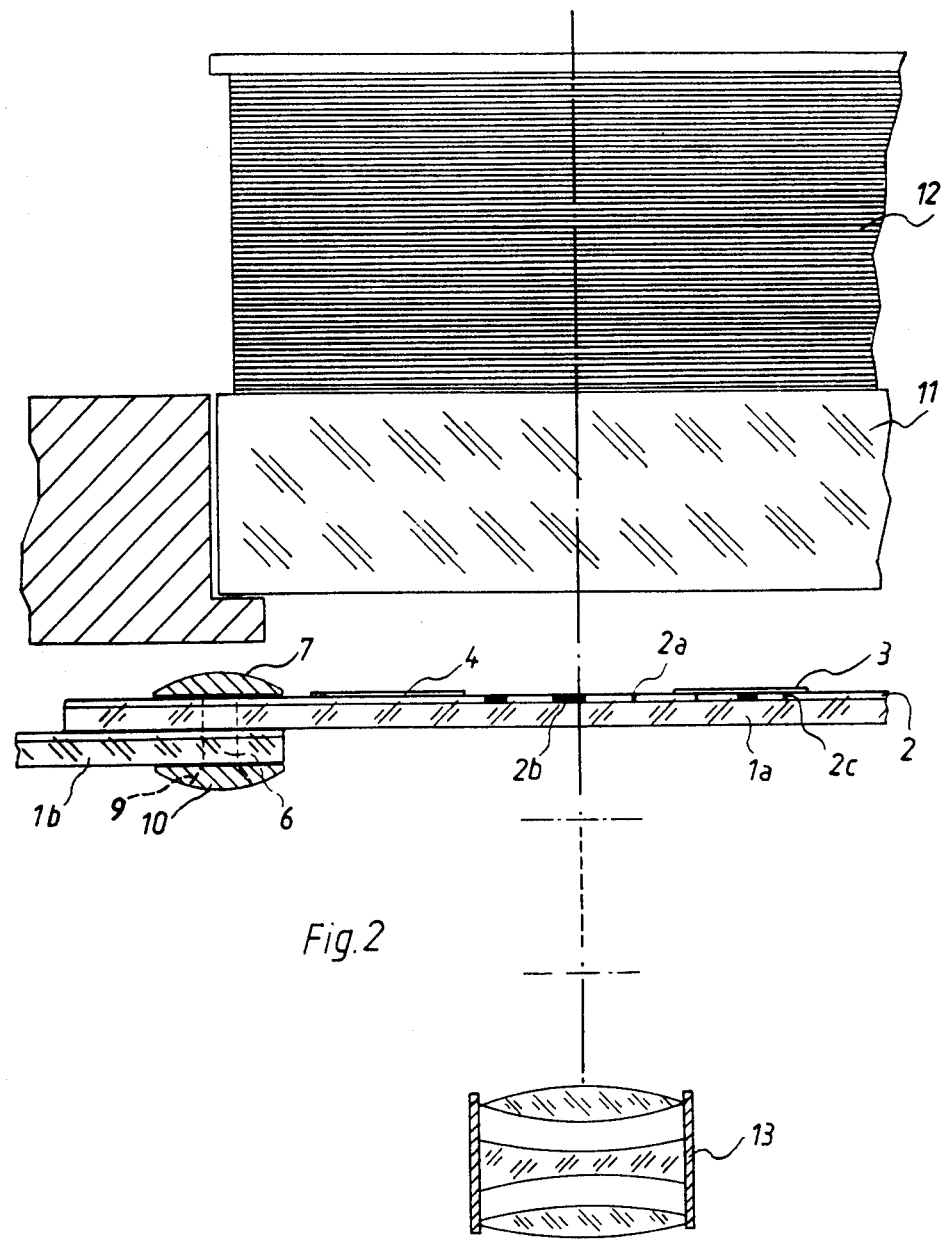
FIG. 2 is an enlarged fragmentary sectional view of a document presentation device in a document reproducing machine, further showing a portion of the improved web.

FIG. 2 shows a portion of a document presentation device in a copying apparatus which utilizes a web including the sections 1a, 1b of FIG. 1. Selected portions of the web are movable into register with a copying aperture which contains a plate-like transparent holder 11 for a stack of originals 12. Each original 12 is imaged onto a copy sheet (not shown) by a system of lenses 13, together with a selected portion of the section 1a or 1b, depending on the nature of information which is to be reproduced on a copy sheet. Such copy sheet is assumed to be located at a level below the lens system 13 of FIG. 2. This illustration further shows (on a greatly enlarged scale), a splice or coupling 7, 10 between the sections 1a, 1b. The photosensitive layer 2 of the section 1a (a portion of which is shown in register with the copying aperture) faces the original 12 which is to be imaged onto the copy sheet together with information on the registering portion of the section 1a. The masks 3, 4 on the emulsion layer 2 of the section 1a overlie selected portions of the information. The overlay or mask 4 is opaque and the overlay or mask 3 is assumed to transmit light so that the additional information 2c below the overlay 3 is reproduced onto the copy sheet. The manner in which selected portions of the section 1a or 1b can be moved into register with the lowermost original 12 on the holder 11 is preferably (but need not be) the same as disclosed in the aforementioned copending application Ser. No. 396,458 of Eppe et al.

The overlay 4 prevents the copying apparatus from imaging that portion of the original 12 on the holder 11 which is located behind the overlay 4. On the other hand, the overlay 3 enables the copying apparatus to reproduce information on the non-overlapped portion of the lowermost original 12 plus the information below the overlay 3. Thus, the copying operation which is shown in FIG. 2 involves imaging onto a copy sheet that portion of the lowermost original 12 which is not overlapped by the overlays 3, 4 plus the additional information 2c below the overlay 3. The information 2c is copied instead of the information (on the lowermost original 12) which is concealed by the overlay 4.

The copying of the lowermost original 12 of FIG. 2 can take place only once or can be repeated as often as desired. This original is then removed so that the holder 11 supports a different original, and the image of such different original can be reproduced onto a copy sheet together with the information on that portion of the section 1a which is shown in register with the holder 11 or with information on another portion of the section 1a or with information on a selected portion of the section 1b (or a selected portion of a further section if the web including the sections 1a, 1b consists of three or more sections). The size of each section of the web may equal or approximate the size of the copying aperture which receives the holder 11.

The overlays 3, 4 are much more resistant to scratching than heretofore known overlays, and they are much less likely to be shifted or peeled off than adhesive-coated overlays. Moreover, the cost of making and applying such overlays is a small fraction of the cost of presently known overlays, and a web which embodies such overlays can be transported at a speed which substantially exceeds the maximum permissible speed of lengthwise transport of conventional webs. Since the thickness of the overlays is minimal, they contribute negligibly to the diameter of that portion of the web which is convoluted onto the core of a supply or takeup reel. As mentioned above, the application of overlays to the carriers of sections in a web of overlays by resorting to heat and pressure does not adversely affect the photosensitive emulsion layers 2 in spite of the fact that the overlays are applied directly to such layers. The application of overlays to that side of a carrier which is coated with the emulsion layer 2 is desirable and advantageous because the parts in a document presentation device normally do not contact the emulsion-coated side of the web so that the overlays are not contacted by such parts when the web is shifted lengthwise in order to place a selected section into register with the copying aperture. It was further found that the quality of copies is improved if the emulsion layer and the overlays are located at the same side of a section.

It is also contemplated to utilize coupling means in the form of zippers, hooks and eyes, strips of adhesive, rolled pressure splices and/or others. However, the coupling means of FIGS. 1 and 2 has been found to be especially practical, not only because it is inexpensive and establishes a reliable connection between the neighboring sections of a web but also because such coupling means can be taken apart with little loss in time and reused as often as desired for the coupling of the same sheets or to couple other pairs of sheets in a web of overlays. The aforedescribed configuration of strips 7, 10 (with relatively sharp edges and convex external surfaces) insures that the coupling offers a minimal resistance to winding of the web onto a supply or takeup reel, as well as that the web can readily pass back and forth during movement of selected sections or portions of sections into register with the copying aperture.

Figure 3:
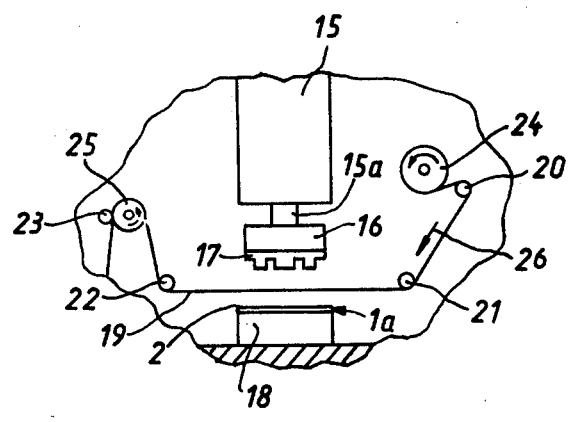
FIG. 3 is a fragmentary partly elevational and partly sectional view of an apparatus which applies overlays to the webs.

FIG. 3 shows the aforementioned ram 17 which is mounted on the piston rod 15a of a fluid-operated motor 15 e.g., a pneumatically operated cylinder and piston unit. The ram 17 is heated by a suitable heating element 16 which is also mounted on the piston rod 15a. The section 1a of the web rests on an anvil or back support 18 below the ram 17. The section 1a can be temporarily affixed to the back support 18.

A foil 19 is guided by rollers 20, 21 22 and 23 so that a portion thereof extends across the space between the retracted ram 17 and the section 1a on the back support 18. This foil consists of a weldable synthetic plastic material and is stored on a supply reel 24. The leader of the foil 19 is connected to the core of a takeup reel 25. The arrow 26 indicates the direction of intermittent lengthwise transport of the foil 19.

When an overlay is to be applied to the section 1a on the back support 18, the motor 15 causes the heated ram 17 to descend and to press the adjacent portion of the foil 19 against the (emulsion-coated) upper side of the section 1a. The motor 15 is preferably designed to urge the foil 19 against the section 1a with a considerable force whereby the foil (which is assumed to be opaque) is welded to the section 1a. The configuration of the bottom surface of the ram 17 is assumed to be such that a single operation of the motor 15 results in the application of several overlays (e.g., the overlays 3 and 4 of FIG. 1) and that such overlays are automatically severed and separated from the adjacent portions of the foil 19.

What is claimed as new and desired to be protected by Letters Patent is set forth in the appended claims:

1. Elongated web for use in a document presentation device in a document reproducing machine having a copying aperture over which an original document to be reproduced is placed, comprising a flexible transparent carrier foil of synthetic plastic material having portions movable into register with the copying aperture and at least one overlay of heat-weldable opaque synthetic plastic sheet material heat-welded to at least one portion of said carrier and serving to conceal information which it is not desired to expose through said copying aperture.

2. A web as defined in claim 1, wherein said carrier has a first side facing the copying aperture when the web is installed in the document presentation device and a second side, said overlay being welded to said first side of said carrier.

3. A web as defined in claim 1, wherein said carrier has a first and a second side and further comprising a layer of photosensitive material coating one of said sides.

4. A web as defined in claim 3, wherein said overlay is welded to said one side of said carrier and overlies the respective portion of said layer.

5. A web as defined in claim 1, wherein said carrier consists of a plurality of neighboring sections and further comprising means for separably coupling the neighboring sections of said carrier to each other.

6. A web as defined in claim 5, wherein the area of each of said sections equals or approximates the area of the copying aperture.

7. A web as defined in claim 5, wherein said coupling means comprises snap fasteners.

8. A web as defined in claim 5 wherein the neighboring sections of said carrier include overlapping portions having registering openings, said coupling means comprising a pair of strips shaped members flanking said overlapping portions, male coupling elements rigid with one of said members, said coupling elements extending through and having portions extending beyond the openings of overlapping portions of said members, and sockets provided in the other of said members and separably receiving said portions of said coupling elements.

9. A web as defined in claim 8, wherein said members have sharp edges extending transversely of said sections.

10. A web as defined in claim 8, wherein the cross-sectional areas of said portions of said coupling elements increase in a direction away from said one member and said sockets have a shape complementary to that of said portions of said coupling elements.

11. A method of affixing overlays which consist of heat-weldable opaque synthetic plastic foil material to a transparent web-like foil-material carrier which also consists, at least in part, of heat-weldable synthetic plastic material and is movable lengthwise in a document presentation device of a document reproducing machine to place selected portions thereof into register with a copying aperture which is overlapped by an original document to be reproduced, comprising the steps of heating the opaque overlays to an elevated temperature at which they are capable of heat-bonding with the foil material of said carrier, and pressing the thus heated opaque overlays against one side of the transparent foil-material carrier so that they become heat-bonded thereto and mask the transparent portions of said carrier to which they are bonded.

12. A method as defined in claim 11, wherein said temperature is between 100° and 200° C.

13. A method as defined in claim 11, further comprising the step of coating said one side of the carrier with a photosensitive emulsion prior to said pressing step.

* * * * *